United States Patent
Ronsisvalle et al.

(10) Patent No.: US 7,868,382 B2
(45) Date of Patent: Jan. 11, 2011

(54) EMITTER-SWITCHED POWER ACTUATOR WITH INTEGRATED ZENER DIODE BETWEEN SOURCE AND BASE

(75) Inventors: Cesare Ronsisvalle, San Giovanni la Punta (IT); Vincenzo Enea, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 163 days.

(21) Appl. No.: 11/971,158

(22) Filed: Jan. 8, 2008

(65) Prior Publication Data
US 2008/0169506 A1    Jul. 17, 2008

Related U.S. Application Data

(63) Continuation-in-part of application No. PCT/EP2006/006670, filed on Jul. 7, 2006.

(30) Foreign Application Priority Data
Jul. 8, 2005    (EP) .................................. 05425492

(51) Int. Cl.
*H01L 29/10* (2006.01)
(52) U.S. Cl. ........................................ 257/335; 257/47
(58) Field of Classification Search ................ 257/337, 257/335, E29.027, E29.066, E29.256, E21.418, 257/47, 197, 198, 205, 206, 361, 362, 370, 257/373, 378, 476, 477, 481, 526–528, 560, 257/575, E27.015, E27.016, E27.02
See application file for complete search history.

(56) References Cited

U.S. PATENT DOCUMENTS

| 3,739,238 | A | 6/1973 | Hara | |
|---|---|---|---|---|
| 4,941,030 | A * | 7/1990 | Majumdar | 257/378 |
| 6,207,484 | B1 * | 3/2001 | Kim et al. | 438/209 |
| 6,459,139 | B2 * | 10/2002 | Watanabe et al. | 257/551 |
| 2004/0033666 | A1 * | 2/2004 | Williams et al. | 438/297 |
| 2008/0169506 | A1 * | 7/2008 | Ronsisvalle et al. | 257/337 |

FOREIGN PATENT DOCUMENTS

EP    0966042 A1    12/1999

\* cited by examiner

*Primary Examiner*—Wai-Sing Louie
*Assistant Examiner*—Bilkis Jahan
(74) *Attorney, Agent, or Firm*—Lisa K. Jorgenson; Robert Iannucci; Seed IP Law Group PLLC

(57) ABSTRACT

A power actuator of the emitter-switched type is described, the power actuator comprising at least one high voltage bipolar transistor and a low voltage DMOS transistor connected in cascode configuration between a collector terminal of the bipolar transistor and a source terminal of the DMOS transistor and having respective control terminals. Advantageously, the power actuator further comprises at least a Zener diode, inserted between the source terminal of the DMOS transistor and the control transistor of the bipolar transistor.

20 Claims, 3 Drawing Sheets

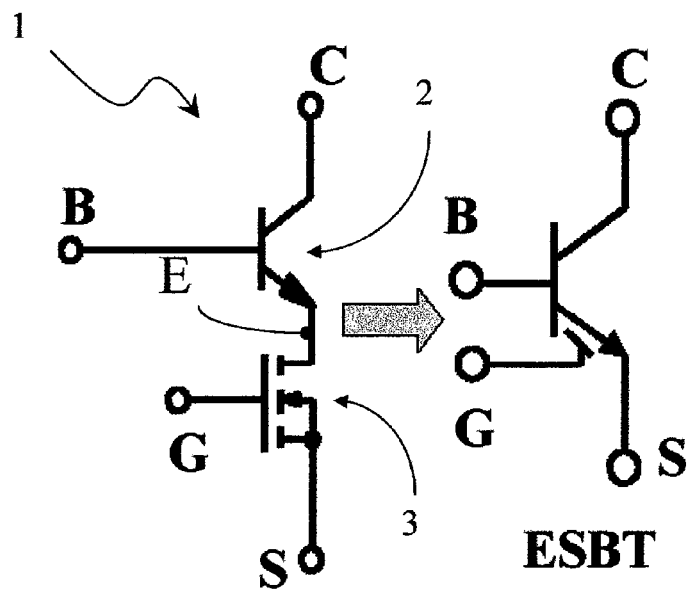
FIG. 1A
PRIOR ART
FIG. 1B
PRIOR ART
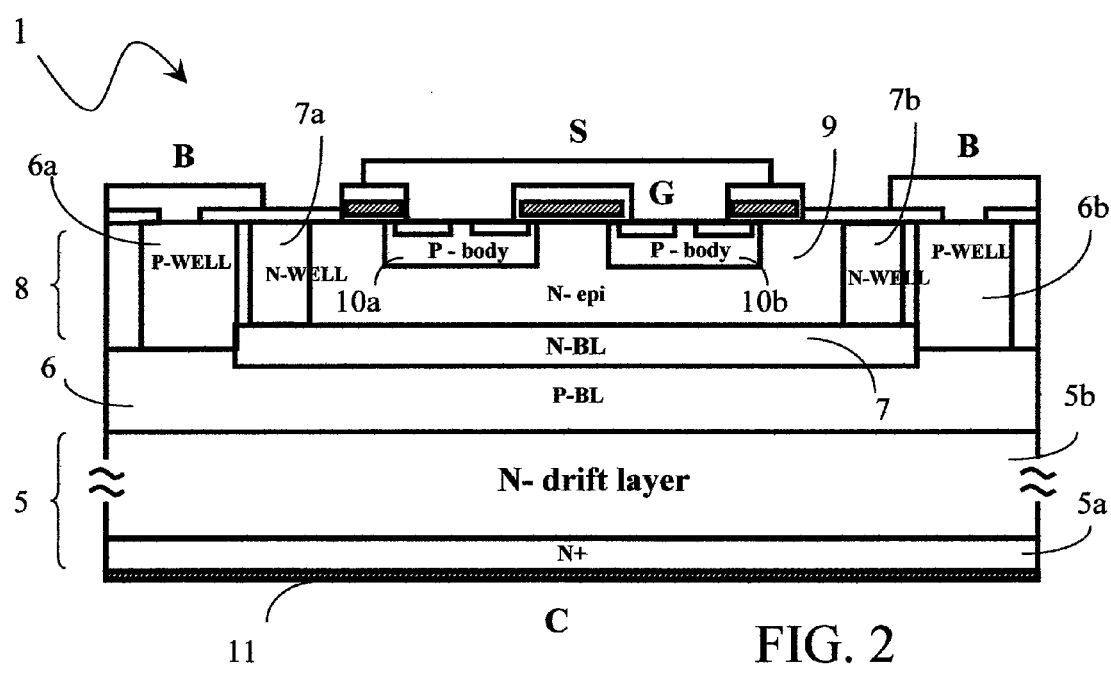
FIG. 2
PRIOR ART

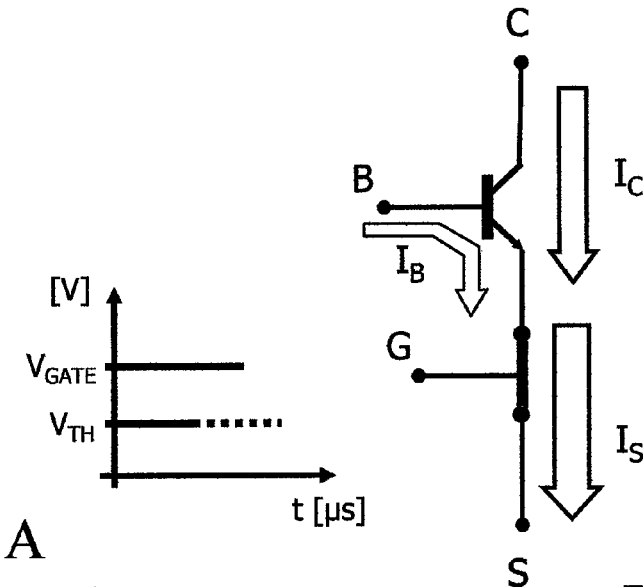
FIG. 3A PRIOR ART
FIG. 3B PRIOR ART
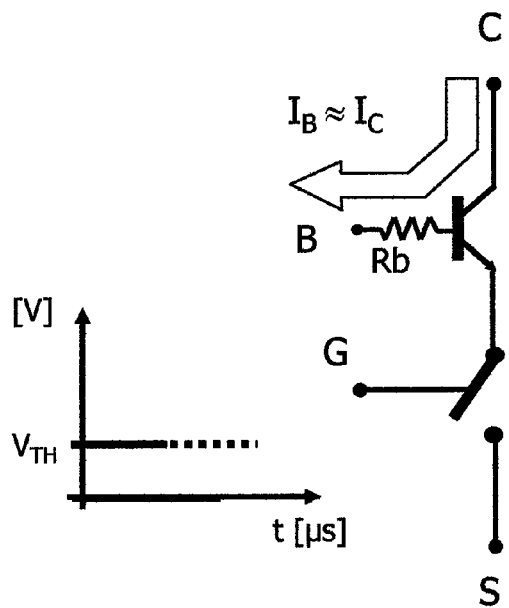
FIG. 4A PRIOR ART
FIG. 4B PRIOR ART

EMITTER-SWITCHED POWER ACTUATOR WITH INTEGRATED ZENER DIODE BETWEEN SOURCE AND BASE

BACKGROUND

1. Technical Field

The present invention relates to a emitter-switched power actuator.

More specifically, the invention relates to a power actuator of the emitter-switched type and comprising at least one high voltage bipolar transistor and a low voltage DMOS transistor connected in cascode configuration between a collector terminal of said bipolar transistor and a source terminal of said DMOS transistor and having respective control terminals.

2. Description of the Related Art

As it is well known, an emitter-switched power actuator is an electronic device able to supply a low voltage drop when conductive as well as a high operative frequency.

In particular, as schematically shown in FIG. 1A, an emitter-switched power actuator, globally indicated with 1, essentially comprises a high voltage bipolar transistor 2 and a low voltage DMOS transistor 3 connected in "cascode" configuration. In such way, the power actuator 1 has a collector terminal C, a base terminal B, a gate terminal G and a source terminal S. Such a power actuator is indicated with ESBT® and it is represented by the equivalent circuit of FIG. 1B.

Thanks to the cascode configuration of the high voltage bipolar transistor 2 and of the low voltage DMOS transistor 3, the power actuator 1 shows a low voltage drop when conductive and a high operative frequency, peculiarity which grows more as the "voltage rating" of the actuator itself increases.

It is possible to monolithically integrate a power actuator 1 of the type described, as schematically shown in FIG. 2.

In particular, the monolithically integrated power actuator 1 comprises a substrate 5, made of a first layer 5a heavily doped with a first type of dopant, in particular N, overlapped by a second layer 5b slightly doped with the first type of dopant N, commonly indicated as drift layer.

Above the substrate 5 a first buried layer 6 of the second type of dopant, in particular P, is realized, corresponding to the base terminal B of the high voltage bipolar transistor 2 of the power actuator 1.

In the first buried layer 6 a second buried layer 7 of the first type of dopant N is then realized whereon an epitaxial layer 8 is arranged always of the first type of dopant N.

A first 7a and a second well 7b of the first type of dopant N with low resistivity are realized in the epitaxial layer 8 suitable to contact the second buried layer 7.

Such second buried layer 7 and the regions 7a and 7b contain a portion 9 of the epitaxial layer 8 wherein a first 10a and a second islands 10b of the second type of dopant P are realized wherein active areas of elementary cells of the DMOS type are provided.

In particular, the islands 10a and 10b realize body regions of such elementary cells of the DMOS type, and they are overlapped by contact structures of the source S and gate G terminals.

The second buried layer 7 realizes instead a buried emitter region E of the high voltage bipolar transistor 2, whose base terminal B is realized by the first buried layer 6, contacted by means of a first 6a and a second well 6b of the second type of dopant P.

In essence, the monolithically integrated power actuator 1 has a symmetrical structure.

Finally, the monolithically integrated power actuator 1 comprises a contact layer 11, below the substrate 5, suitable to realize the collector terminal C of the high voltage bipolar transistor 2.

The first 7a and the second well 7b of the first type of dopant N not only contain the elementary cells of the DMOS type in the portion 9 of the epitaxial layer 8, but also allow to inhibit a lateral parasitic transistor realized by the conductivity alternation of the wells 6a, 7a and of the islands 10a, respectively of the wells 6, 7b and of the islands 10b.

It should be noted that, since the low voltage DMOS transistor 3 is connected in series to the emitter of the high voltage bipolar transistor 2, it is a non-negligible series resistance which increases the voltage drop during the conduction phase of the actuator as a whole as schematically shown in FIG. 3B, where Is is the current flowing through said low voltage DMOS transistor 3.

In particular, the low voltage DMOS transistor 3 is in the ON state when the voltage $V_{GATE}$ of the gate terminal G is higher than a threshold voltage value Vth, as shown in FIG. 3A.

To decrease the resistance of the low voltage DMOS transistor 3 it is possible to increase the perimeter density of the channel. In such case it is however necessary to realize the power actuator 1 with a more sophisticated technology.

It is also possible to use, as DMOS transistor 3, a transistor MOS having an even lower voltage and a less resistive drain region. In such case, however, also a reduction can be obtained of the highest value of the current which can be switched by the power actuator 1.

In fact, during the turn-off of the actuator 1, all the collector current Ic of the high voltage bipolar transistor 2 is deviated on its base terminal B, as shown in FIG. 4B.

In particular, the low voltage DMOS transistor 3 is in the OFF state when the voltage $V_{GATE}$ of the gate terminal G is null, as shown in FIG. 4A.

As a consequence, a voltage drop is generated on an external resistance Rb connected to the base terminal B which increases in turn the voltage value of the base terminal B of the high voltage bipolar transistor 2 substantially corresponding to the drain-source voltage of the low voltage DMOS transistor 3.

If this voltage value of the base terminal B overcomes a breakdown voltage value of the drain-source junction of the low voltage DMOS transistor 3, a portion of the collector current Ic will flow again through the base-emitter junction of the high voltage bipolar transistor 2. In such case, the power actuator 1 is under inverted secondary breakdown conditions.

BRIEF SUMMARY

One embodiment is a power actuator having such structural and functional characteristics as to allow to overcome the limits still affecting the devices realized according to the prior art.

One embodiment inserts, in the power actuator, a Zener diode connected between the source terminal of the low voltage DMOS transistor and the base terminal of the high voltage bipolar transistor.

Advantageously, the Zener diode is incorporated in a monolithic structure of the monolithically integrated power actuator.

One embodiment is a power actuator as previously indicated and defined by the characterizing part of claim 1.

The characteristics and advantages of the invention will be apparent from the following description of an embodiment thereof given by way of indicative and non-limiting example with reference to the annexed drawings.

BRIEF DESCRIPTION OF THE SEVERAL VIEWS OF THE DRAWINGS

In such drawings:

FIGS. 1A and 1B show an equivalent circuit of a power actuator ESBT® and its symbol;

FIG. 2 schematically shows, in section, an elementary cell of the monolithically integrated power actuator of FIG. 1;

FIGS. 3A and 4A schematically show gate voltage values at the power actuator of FIG. 1A under different operative conditions;

FIGS. 3B and 4B schematically show the power actuator of FIG. 1A under the different operative conditions of FIGS. 3A and 4A, respectively;

DETAILED DESCRIPTION

Figure 5:
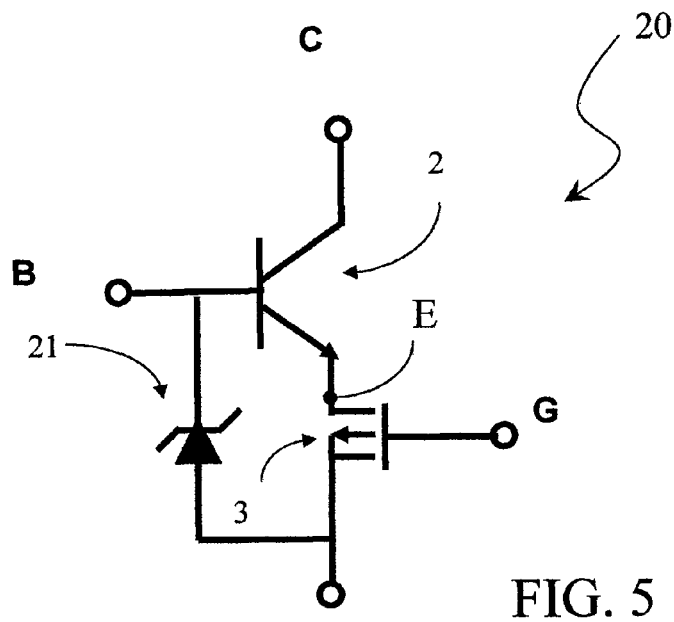
FIG. 5 schematically shows a power actuator realized according to the invention.

With reference to such Figures, and in particular to FIG. 5, a power actuator realized according to the present invention is globally and schematically indicated at 20.

By way of illustration, elements being structurally and functionally identical with respect to the power actuator described with reference to the prior art will be given the same reference numbers.

Moreover, the Figures showing schematic views of portions of an integrated structure are not drawn to scale, but they are instead drawn so as to emphasize the important characteristics of the invention.

The power actuator 20 is of the emitter-switched type and it essentially comprises a high voltage bipolar transistor 2 and a low voltage DMOS transistor 3 connected in "cascode" configuration. In such way, the power actuator 1 has a collector terminal C, a base terminal B, a gate terminal G and a source terminal S.

Advantageously, the power actuator 20 also comprises a Zener diode 21, inserted between the source terminal S of the low voltage DMOS transistor 3 and the base terminal B of the high voltage bipolar transistor 2.

Suitably, such Zener diode 21 is chosen so as to have a Zener voltage lower than a breakdown voltage of the low voltage DMOS transistor 3.

In this way, in fact, when the base voltage value of the high voltage bipolar transistor 2, during the turn-off phase, overcomes the value of the Zener voltage, a portion of the collector current Ic of the high voltage bipolar transistor 2 flows through the Zener diode 21 towards the source terminal S of the low voltage DMOS transistor 3, without however flowing through the base-emitter junction of the high voltage bipolar transistor 2.

The power actuator 20 thus allows to avoid the inverted secondary breakdown conditions still affecting the actuators realized according to the prior art.

It should be noted that the power actuator 20 thus allows to use as DMOS transistor 3, a MOS transistor having an even lower voltage and a less resistive drain region, however without incurring inverted secondary breakdown problems during the turn-off of the DMOS transistor 3 itself, thanks to the presence of the Zener diode 21.

In a preferred embodiment of the power actuator 20, the Zener diode 21 is incorporated in the monolithic structure of the actuator itself, in particular placed as close as possible to the base-emitter junction of the high voltage bipolar transistor 2.

In fact, it has been experimentally verified with simulations in transient that the speed of the Zener diode 21 should be enough as to ensure its intervention before the low voltage DMOS transistor 3 enters avalanche conditions. Such intervention speed of the Zener diode 21 can be ensured by its monolithic integration with the power actuator 20.

Figure 6:
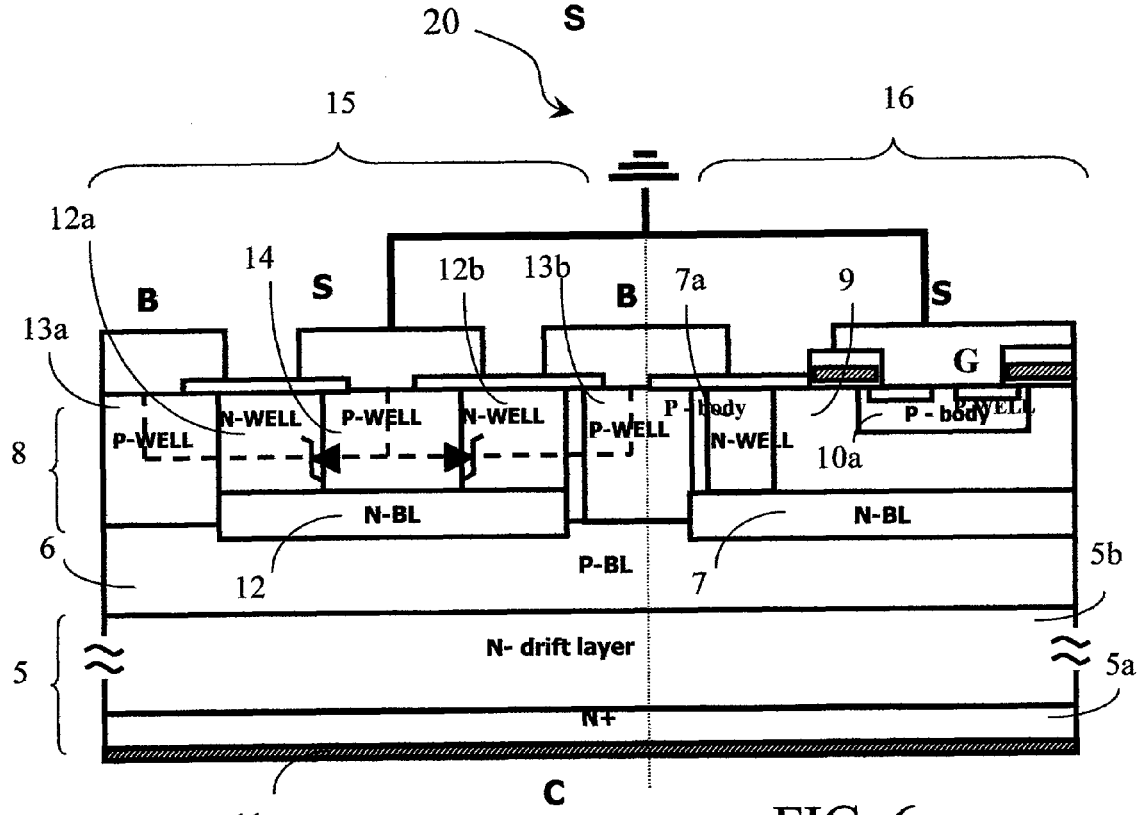
FIG. 6 schematically shows the monolithically integrated power actuator of FIG. 5.

As it will be better explained hereafter, it is possible to monolithically integrate a power actuator 20 as above described, as schematically shown in FIG. 6, without adding process phases to a manufacturing process of a power actuator as described in relation with the prior art.

In particular, the monolithically integrated power actuator 20 comprises a substrate 5, made of a first layer 5a heavily doped with a first type of dopant, in particular N, overlapped by a second layer 5b slightly doped with the first type of dopant N, commonly indicated as drift layer.

A first buried layer 6 of a second type of dopant, in particular P, is realized above the substrate 5 corresponding to the base of the high voltage bipolar transistor 2 of the power actuator 1.

A second buried layer 7 of the first type of dopant N is then realized in the first buried layer 6, whereon an epitaxial layer 8 is arranged, being always of the first type of dopant N.

Inside the epitaxial layer 8 the low voltage DMOS transistor 3 is integrated, as it has been seen in relation with the prior art, equipped with contact structures for the source S and gate G terminals.

The second buried layer 7, contacted by means of at least a first well 7a of the first type of dopant N, realizes instead a buried emitter of the high voltage bipolar transistor 2, whose base terminal B is realized by the first buried layer 6, contacted by at least a second well of the second type of dopant P.

The monolithically integrated power actuator 20 also comprises a contact layer 11, below the substrate 5, suitable to realize the collector terminal C of the high voltage bipolar transistor 2.

Advantageously, the Zener diode 21 is integrated in an end portion 15 of the integrated structure, the end portion being contiguous to the first well 7a, i.e. contiguous to a second portion 16 wherein the high voltage bipolar transistor 2 and the low voltage DMOS transistor 3 are integrated.

As shown in FIG. 6, the source terminal is connected to ground and the Zener diode 21 is advantageously connected between the base terminal B of the low voltage DMOS transistor 3 and ground.

In particular, the Zener diode 21 is realized by using wells of the first N and of the second P type of dopant, corresponding to those realized during the integration process of the bipolar transistor 2 and of the DMOS transistor 3. In other words, the Zener diode 21 comprises wells of the first and second type of dopant simultaneously realized with wells of the first and second type of dopant of the second portion 16.

The end portion 15 thus has a further buried layer 12, realized in the first buried layer 6 and delimited by a first 13a and by a second well 13b of the second type of dopant P. In particular, the second well 13b corresponds to the second contact well of the first buried layer 6 of the monolithically integrated power actuator 20.

Moreover, such end portion 15 comprises a first 12a and a second wells 12b, realized above the further buried layer 12 and in contact therewith, containing a further well 14 of the second type of dopant P.

In such way, the Zener diode 21 is realized as a lateral transistor with open base, indicated with dot lines in FIG. 6.

In particular, such transistor with open base has, as emitter region, the wells 13a and 13b of the second type of dopant P, connected to the base region of the high voltage bipolar transistor 2, as base region the wells 12a and 12b of the first type of dopant N, under floating condition and, as collector region, the further well 14 of the second type of dopant P, which is then electrically connected to the source terminal S of the low voltage DMOS transistor 3 by a metal track.

The Zener diode 21 so realized has a Zener voltage equal to the voltage BVceo of such transistor with open base, which is obviously lower than a breakdown voltage value of the low voltage DMOS transistor 3 of the power actuator 20 since the distances between the wells realizing such transistor with open base, i.e. the Zener diode 21, are far more reduced than the distances between the wells realizing the low voltage DMOS transistor 3.

In such way, it is immediate to verify how the integration of the Zener diode 21 does not require the introduction of further process phases in a flow suitable to integrate the high voltage bipolar transistor 2 and the low voltage DMOS transistor 3 of the power actuator 20.

It should be also noted that, since the power actuator 20 comprises a Zener diode 21 monolithically integrated in the end portion 15, it is possible to integrate a DMOS transistor having a lower breakdown voltage with respect to the known solutions and thus having a even lower resistances when conductive.

Moreover, to obtain an adequate speed of the Zener diode 21, the end portion 15 is chosen in correspondence with the source pad of the power actuator 20, and in particular of the corresponding bus.

In other words, the cross section shown in FIG. 6 corresponds to one part of the terminal of the so called emitter finger near the source pad bus, while the unchanged portion corresponding to the portion of the emitter/source finger in the rest of the power actuator 20 is not shown.

In summary, the power actuator 20 of the emitter-switched type and a Zener diode 21 inserted between the source terminal S of the low voltage DMOS transistor 3 and the base terminal B of the high voltage bipolar transistor 2 of the emitter-switching device.

More particularly, the Zener diode 21 "routes" a portion of the collector current of the high voltage bipolar transistor 2 during its turn-off phase towards the source terminal S of the low voltage DMOS transistor 3, thus avoiding inverted secondary breakdown conditions still affecting the prior art actuators.

Advantageously, the Zener diode 21 have a Zener voltage lower than the breakdown voltage of the low voltage DMOS transistor 3 in order to "drawn" such a portion of the collector current.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A monolithically-integrated structure, comprising:
an emitter-switched power actuator that includes a high voltage bipolar transistor and a low voltage DMOS transistor connected in cascode configuration between a collector terminal of said bipolar transistor and a source terminal of said DMOS transistor and having respective control terminals; and
a Zener diode monolithically integrated within an end portion of the monolithically-integrated structure and between said source terminal of said DMOS transistor and said control terminal of said bipolar transistor.

2. The monolithically-integrated structure of claim 1 wherein said Zener diode has a Zener voltage lower than a breakdown voltage of said DMOS transistor.

3. The monolithically-integrated structure of claim 1 wherein said Zener diode is positioned on an opposite side of an emitter well with respect to a body well of the DMOS transistor.

4. The monolithically-integrated structure of claim 1 wherein said Zener diode is integrated near a base-emitter junction of said bipolar transistor.

5. The monolithically-integrated structure of claim 4 wherein said end portion is contiguous to a second portion wherein said bipolar and DMOS transistors are integrated.

6. The monolithically-integrated structure of claim 1 wherein said Zener diode comprises first and second wells of first and second dopant types, respectively, the bipolar transistor including an emitter well of the first dopant type positioned on an opposite side of the second well with respect to the first well.

7. The monolithically-integrated structure of claim 6 wherein said end portion comprises a first buried layer of the first dopant type positioned between the first well and a second buried layer of said second dopant type, the second buried layer being contiguous with the second well.

8. The monolithically-integrated structure of claim 7 wherein said end portion further comprises third and fourth wells of the first and second dopant types realized above said first buried layer and in contact therewith.

9. The monolithically-integrated structure of claim 8 wherein said first and third wells of the first dopant type are positioned on opposite sides of the fourth well of said second dopant type.

10. The monolithically-integrated structure of claim 6 wherein said first well is in correspondence with a pad of said source terminal.

11. The monolithically-integrated structure of claim 1 wherein said DMOS transistor is a low voltage MOS transistor with a drain region of low resistivity.

12. A monolithically integrated structure, comprising:
an emitter-switched power actuator that includes a high voltage bipolar transistor a low voltage DMOS transistor connected in cascode configuration between a collector terminal of said bipolar transistor and a source terminal of said DMOS transistor and having respective control terminals, the bipolar transistor including a buried emitter layer, an emitter well in contact with the buried emitter layer, a buried base layer, and a base well in contact with the buried base layer; and
a Zener diode monolithically integrated between said source terminal of said DMOS transistor and said control terminal of said bipolar transistor, said Zener diode having a Zener voltage lower than a breakdown voltage of said DMOS transistor, wherein the Zener diode includes a first well positioned on an opposite side of the base well with respect to the emitter well.

13. The monolithically integrated structure according to claim 12, said Zener diode is integrated near a base-emitter junction of said bipolar transistor.

14. The monolithically integrated structure according to claim 13, wherein said Zener diode is integrated in an end portion of said monolithically integrated structure, said end portion being contiguous to a second portion wherein said bipolar and DMOS transistors are integrated.

15. The monolithically integrated structure according to claim 14, wherein the first well and the emitter well are of a first dopant type and the base well is of a second dopant type.

16. The monolithically integrated structure according to claim 15, wherein said end portion comprises a buried layer adjoining the buried base layer, said buried layer being of said first dopant type and said buried base layer being of said second dopant type, the end portion including a second well of the second dopant type positioned on an opposite side of the buried layer with respect to the buried layer.

17. The monolithically integrated structure according to claim 16, wherein said end portion further comprises said a third well of the first dopant type realized above and in contact with said buried layer.

18. The monolithically integrated structure according to claim 17, wherein the end portion includes a fourth well of said second dopant type positioned between the first and third wells.

19. The monolithically integrated structure according to claim 14, wherein said end portion is in correspondence with a pad of said source terminal.

20. The monolithically integrated structure according to claim 12, wherein said DMOS transistor is a low voltage MOS transistor with a drain region of low resistivity.

* * * * *